United States Patent
Palaniappa et al.

(10) Patent No.: US 9,835,650 B2
(45) Date of Patent: Dec. 5, 2017

(54) PACKAGED DEVICE ADAPTER WITH PARAMETER INDICATION

(71) Applicant: Ironwood Electronics, Inc., Eagan, MN (US)

(72) Inventors: Ilavarasan M. Palaniappa, Eagan, MN (US); Mickiel P. Fedde, Eagan, MN (US); Vinayak Reddy Panavala, Shakopee, MN (US); Sultan M. Faiz, St. Paul, MN (US); Scott Delano, Plymouth, MN (US)

(73) Assignee: IRONWOOD ELECTRONICS, INC., Eagan, MN (US)

( * ) Notice: Subject to any disclaimer, the term of this patent is extended or adjusted under 35 U.S.C. 154(b) by 599 days.

(21) Appl. No.: 14/300,808

(22) Filed: Jun. 10, 2014

(65) Prior Publication Data

US 2015/0355234 A1 Dec. 10, 2015

(51) Int. Cl.
*G01R 1/04* (2006.01)

(52) U.S. Cl.
CPC .................. *G01R 1/0466* (2013.01)

(58) Field of Classification Search
CPC ............ G01R 29/0814; G01R 31/1227; G01R 31/2825; G01R 31/14; G01R 31/1236; G01R 1/0466
USPC ...... 324/500, 756.01–758.01, 762.02, 76.11, 324/106, 757.04, 754.01–754.07, 690, 324/696, 715, 724; 439/70, 71, 387, 69
See application file for complete search history.

(56) References Cited

U.S. PATENT DOCUMENTS

| | | | |
|---|---|---|---|
| 4,460,223 A | 7/1984 | Brown et al. | |
| 5,358,412 A * | 10/1994 | Maurinus | G02F 1/13452 349/150 |
| 5,730,620 A | 3/1998 | Chan et al. | |
| 5,791,914 A | 8/1998 | Loranger et al. | |
| 5,892,245 A | 4/1999 | Hilton | |
| 6,229,320 B1 * | 5/2001 | Haseyama | G01R 1/0466 324/750.25 |
| 6,351,392 B1 | 2/2002 | Palaniappa | |
| 6,394,820 B1 | 5/2002 | Palaniappa et al. | |
| 6,533,589 B1 | 3/2003 | Palaniappa et al. | |
| 6,877,993 B2 | 4/2005 | Palaniappa et al. | |
| 6,981,882 B1 | 1/2006 | Palaniappa | |
| 7,368,814 B1 | 5/2008 | Tully et al. | |
| 7,565,843 B2 | 7/2009 | Palaniappa et al. | |

(Continued)

*Primary Examiner* — Melissa Koval
*Assistant Examiner* — Trung Nguyen
(74) *Attorney, Agent, or Firm* — Mueting, Raasch & Gebhardt, P.A.

(57) ABSTRACT

An adapter apparatus and method includes using an adapter body defining a socket cavity configured to receive a packaged device and a socket lid assembly configured to apply a force upon a packaged device received in the socket cavity of the adapter body. A measurement apparatus associated with the socket lid assembly may include a measurement element (e.g., temperature sensing element, compressible element, etc.) that is configured to contact a packaged device received in the socket cavity when the socket lid assembly closes the socket cavity and applies a force upon the packaged device (e.g., a measurement signal is generated with use of the measurement element that is configured to contact the packaged device). An indicator may be configured to display a parameter based on the measurement signal (e.g., a count, a temperature, etc.).

20 Claims, 10 Drawing Sheets

(56) References Cited

U.S. PATENT DOCUMENTS

| | | |
|---|---|---|
| 7,874,880 B2 | 1/2011 | Fedde et al. |
| 8,091,222 B2 | 1/2012 | Fedde et al. |
| 2005/0196979 A1 | 9/2005 | Fedde et al. |
| 2010/0236064 A1 | 9/2010 | Fedde et al. |
| 2014/0370725 A1 | 12/2014 | Palaniappa et al. |
| 2014/0370727 A1 | 12/2014 | Palaniappa et al. |
| 2016/0224055 A1* | 8/2016 | Simolon ................ G01R 23/00 |

* cited by examiner

PACKAGED DEVICE ADAPTER WITH PARAMETER INDICATION

BACKGROUND

The present disclosure relates to electrical adapters and methods using such adapters. More particularly, the present disclosure pertains to employing a parameter indicating apparatus with adapters for packaged integrated circuit devices (e.g., micro lead frame packages, micro lead chip carriers, quad flat no lead packages, and micro ball grid array packages, etc.) and methods for using such adapters.

Certain types of integrated circuit packages are becoming increasingly popular due to their occupancy area efficiency. In other words, they occupy less area on a target board on which they are mounted while providing a high density of contact terminals. For example, one such high density package type is a micro lead frame package. Generally, such packages contain an integrated circuit having its die bond pads electrically connected to respective conductive contact lead elements (e.g., lands) that are distributed on a surface of the package (e.g., the bottom surface of the package, for example, in an array).

A target printed circuit board upon which the package is to be mounted typically has formed on its surface a corresponding array of conductive pads which are aligned with the conductive contact lead elements of the package for electrically mounting the package on the target board. The target board typically includes other conductive traces and elements which lead from the array of conductive pads used for mounting the package to other circuitry on the board for connecting various components mounted thereon.

Typically, to mount such a package to a target board, solder material (e.g., solder balls) is provided in a manner corresponding to the array of conductive pads on the target board. The package is positioned with the contact lead elements in contact with the solder material corresponding to the array of conductive pads on the target board. The resulting structure is then heated until the solder material is melted and fused to the contact lead elements of the package.

Such area efficient packaging, e.g., micro lead frame packages or micro ball grid array packages, provide a high density of terminals at a very low cost. Also, this packaging provides for limited lead lengths. The limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a package mounted thereon, the designer must first electrically connect the package to the target circuit board (e.g., using solder balls).

As described above, this may include mounting the package on the target board and heating the solder material (e.g., solder spheres) to fuse the solder material to the contact lead elements of the package. Therefore, the package may be prevented from being used again. It is desirable for various reasons to use packaged device adapters for mounting the packages and reuse such packages after testing. For example, such device packages may be relatively expensive. Further, for example, once attached, the solder material and/or the contact lead elements (e.g., land pads) are not accessible for testing. In addition, it is often difficult to rework the circuit board with the packages soldered thereon.

Various adapters are available for use in electrically connecting a package to a target board for one or more purposes. For example, U.S. Pat. No. 7,565,843 to Palaniappa et al., entitled "Packaged Device Adapter with Torque Indicating Assembly," issued 28 Jul. 2009; U.S. Pat. No. 6,533,589 to Palaniappa et al., entitled "Packaged Device Adapter Assembly," issued 18 Mar. 2003; U.S. Pat. No. 6,394,820 to Palaniappa et al., entitled "Packaged Device Adapter Assembly And Mounting Apparatus," issued 28 May 2002; U.S. Pat. No. 5,791,914 to Loranger et al., entitled "Electrical Socket With Floating Guide Plate," issued 11 Aug. 1998; U.S. Pat. No. 4,460,223 to Brown et al., entitled "Cover For Chip Carrier Socket," issued 17 Jul. 1984; U.S. Pat. No. 5,892,245 to Hilton, entitled "Ball grid Array Package Emulator," issued 6 Apr. 1999; and U.S. Pat. No. 5,730,620 to Chan et al., entitled "Method And Apparatus For Locating Electrical Circuit Members," issued 24 Mar. 1998, all describe various adaptors that are used for mounting or locating packaged devices. Many of such adaptors include lid assemblies for applying force or pressure on the packaged devices such that electrical contact of the packaged device conductive pads (e.g., pads on the bottom surface of the device) to corresponding contacts (e.g., a conductive elastomer or other arrangement of conductive elements, or further target board conductive land pads) is achieved.

In packaged device testing, measurement of various parameters with respect to the device under test or the adapter used for testing may be useful.

SUMMARY

The present disclosure provides a measurement apparatus (e.g., for counting and displaying the number of times an adapter is used, for measuring and displaying temperature of a packaged device under test, etc.) that, for example, may be employed with a packaged device adapter for use in mounting or locating high density integrated circuit packages (e.g., micro lead frame packages, micro lead chip carriers, quad flat no lead packages, and micro ball grid array packages, etc.).

One exemplary embodiment of an adapter apparatus according to the present disclosure is for use with a packaged device having a plurality of contact elements disposed on a surface thereof. The adapter apparatus includes an adapter body defining a socket cavity configured to receive a packaged device, a socket lid assembly configured to apply a force upon a packaged device received in the socket cavity of the adapter body such that the plurality of contact elements of the packaged device are electrically connected to conductive elements corresponding thereto, and an actuation apparatus associated with the socket lid assembly (i.e., wherein the actuation apparatus is actuated when the socket lid assembly closes the socket cavity and applies a force upon the packaged device), counter circuitry configured to increment a count when the actuation apparatus is actuated, and an indicator configured to display a parameter based on the incremented count.

In one or more embodiments of the adapter apparatus, the indicator may be configured to display a count of the number of times the actuation apparatus is actuated. Further, the adapter apparatus may include reset circuitry to reset the count to zero.

Further, in one or more embodiments of the adapter apparatus, the actuation apparatus associated with the socket lid assembly may include a compressible element at a surface of the socket lid assembly that is actuated upon contact with the packaged device when the socket lid assembly closes the socket cavity and applies a force upon the packaged device, the indicator may include a display viewable only when the socket lid assembly is in an open state such that a packaged device may be received within the socket cavity, the counter circuitry may be integrated into the socket lid assembly, and/or the adapter apparatus may further include a temperature sensing apparatus associated with the socket lid assembly (e.g., wherein the temperature sensing apparatus may include a sensing element that is configured to touch a packaged device received in the socket cavity to sense the temperature of the packaged device when the socket lid assembly closes the socket cavity and applies a force upon the packaged device) and a temperature indicator configured to display a parameter based on the sensed temperature.

One exemplary embodiment of a method of testing packaged devices using an adapter apparatus according to the present disclosure (e.g., wherein each of the packaged devices may include a plurality of contact elements disposed on a surface thereof) may include providing an adapter body defining a socket cavity therein configured to receive a packaged device, providing a socket lid assembly configured to apply a force upon a packaged device received in the socket cavity of the adapter body such that the plurality of contact elements of the packaged device are electrically connected to conductive elements corresponding thereto, positioning a packaged device in the socket cavity, closing the socket lid assembly to apply a force upon the packaged device received in the socket cavity of the adapter body such that the plurality of contact elements of the packaged device are electrically connected to conductive elements corresponding thereto, and incrementing a counter upon closing the socket lid assembly and applying a force upon the packaged device received in the socket cavity of the adapter body.

One or more embodiments of the method may include repeating the positioning of a packaged device in the socket cavity, closing the socket lid assembly to apply a force upon the packaged device received in the socket cavity of the adapter body, and incrementing a counter upon closing the socket lid assembly for one or more additional packaged devices. A count may then be displayed based on the incremented counter.

Further, in one or more embodiments, the method may include one or more of the following features and/or processes: resetting the incremented counter; displaying the count only when the socket lid assembly is in an open state such that a packaged device may be received within the socket cavity; providing an actuation apparatus associated with the socket lid assembly (e.g., wherein the actuation apparatus is actuated when the socket lid assembly closes the socket cavity and applies a force upon the packaged device) and incrementing a counter based on the actuation of the actuation apparatus; a compressible element at a surface of the socket lid assembly that is actuated upon contact with the packaged device when the socket lid assembly closes the socket cavity and applies a force upon the packaged device; and/or displaying a temperature of the packaged device upon closing the socket lid assembly and applying a force upon the packaged device received in the socket cavity of the adapter body.

Another exemplary embodiment of an adapter apparatus according to the present disclosure is for use with a packaged device having a plurality of contact elements disposed on a surface thereof. The exemplary adapter apparatus may include an adapter body defining a socket cavity configured to receive a packaged device, a socket lid assembly configured to apply a force upon a packaged device received in the socket cavity of the adapter body such that the plurality of contact elements of the packaged device are electrically connected to conductive elements corresponding thereto, and a measurement apparatus associated with the socket lid assembly (e.g., wherein the measurement apparatus may include a measurement element that is configured to contact a packaged device received in the socket cavity when the socket lid assembly closes the socket cavity and applies a force upon the packaged device). A measurement signal may be generated with use of the measurement element that is configured to contact the packaged device and an indicator may be configured to display a parameter based on the measurement signal.

In one or more embodiments of the exemplary adapter apparatus, the measurement apparatus may include an actuation apparatus associated with the socket lid assembly (e.g., wherein the actuation apparatus is actuated when the socket lid assembly closes the socket cavity and applies a force upon a packaged device); the indicator being configured to display a count of the number of times the actuation apparatus is actuated.

Further, in one or more embodiments of the exemplary adapter apparatus, the measurement apparatus associated with the socket lid assembly may include a temperature sensing apparatus associated with the socket lid assembly (e.g., wherein the temperature sensing apparatus may include a sensing element that is configured to touch a packaged device received in the socket cavity to sense the temperature of the packaged device when the socket lid assembly closes the socket cavity and applies a force upon the packaged device); the indicator being configured to display a parameter based on the sensed temperature.

Further, in one or more embodiments of the adapter apparatus, a thermocouple may be configured at a surface of the socket lid assembly such that the thermocouple is in contact with the packaged device when the socket lid assembly closes the socket cavity and applies a force upon the packaged device, the indicator may be viewable when the socket lid assembly is in a closed state when the socket lid assembly closes the socket cavity and applies a force upon a packaged device received within the socket cavity, and/or the measurement apparatus may include measurement and display circuitry integrated into the socket lid assembly.

Another exemplary embodiment of a method of testing packaged devices using an adapter apparatus according to the present disclosure (e.g., wherein each of the packaged devices may include a plurality of contact elements disposed on a surface thereof) may include providing an adapter body defining a socket cavity therein configured to receive a packaged device, providing a socket lid assembly configured to apply a force upon a packaged device received in the socket cavity of the adapter body such that the plurality of contact elements of the packaged device are electrically connected to conductive elements corresponding thereto, providing a measurement apparatus associated with the socket lid assembly (e.g., wherein the measurement apparatus may include a measurement element that is configured to contact a packaged device received in the socket cavity when the socket lid assembly closes the socket cavity and applies a force upon the packaged device), positioning a packaged device in the socket cavity, closing the socket lid assembly to apply a force upon the packaged device received in the socket cavity of the adapter body such that the plurality of contact elements of the packaged device are electrically connected to conductive elements corresponding thereto (e.g., a measurement signal begin generated using the measurement element), and displaying a parameter based on the measurement signal.

In one or more embodiments of the method, providing the measurement apparatus may include providing an actuation apparatus associated with the socket lid assembly (e.g., wherein the actuation apparatus is actuated when the socket lid assembly closes the socket cavity and applies a force upon a packaged device), and further, displaying a parameter based on the measurement signal may include displaying a count of the number of times the actuation apparatus is actuated.

Further, in one or more embodiments of the method, providing the measurement apparatus may include providing a temperature sensing apparatus associated with the socket lid assembly (e.g., wherein the temperature sensing apparatus may include a temperature sensing element, for example, a thermocouple, that is configured to touch a packaged device received in the socket cavity to sense the temperature of the packaged device when the socket lid assembly closes the socket cavity and applies a force upon the packaged device), and further, displaying a parameter based on the measurement signal may include displaying a parameter based on the sensed temperature.

Further, in one or more embodiments of the method, displaying a parameter based on the sensed temperature may include displaying a temperature at a location viewable when the socket lid assembly is in a closed state when the socket lid assembly closes the socket cavity and applies a force upon a packaged device received within the socket cavity.

The above summary is not intended to describe each embodiment or every implementation of the present disclosure. Advantages, together with a more complete understanding of the disclosure, will become apparent and appreciated by referring to the following detailed description and claims taken in conjunction with the accompanying drawings.

DETAILED DESCRIPTION OF THE EMBODIMENTS

Generally, a packaged device adaptor apparatus for use with packaged devices (e.g., high density devices) which employs various types of measurement apparatus (e.g., for counting and displaying the number of times an adapter is used, for measuring and displaying temperature of the packaged device under test, etc.), as well as methods employing such adaptor apparatus, shall be described herein. Illustrative packaged device adaptor apparatus (e.g., adaptor apparatus 10 and 200) shall be described with reference to FIGS. 1-8.

One skilled in the art will recognize from the description herein that the various illustrative embodiments described include some features or elements included in other illustrative embodiments and/or exclude other features. However, packaged device adaptor apparatus may include any combination of elements selected from one or more of the various embodiments as described herein with reference to FIGS. 1-8. For example, as will be readily apparent from the description below, one or more different types of socket bodies, including, for example, a clamshell socket, a pogo pin socket, etc., may utilize the measurement features described herein. For example, measurement and display apparatus of an adapter apparatus described in combination with one embodiment may be used in a different embodiment (e.g., a counting feature may be used alone or in combination with a temperature sensing feature, a temperature sensing feature may be used alone or in combination with other measurement features, etc.). One skilled in the art will readily recognize that an adaptor apparatus employed for one or more various purposes (e.g., locating a packaged device on a target board, mounting a packaged device for testing purposes relative to a target board, etc.) may benefit from the features described herein.

Figure 1:
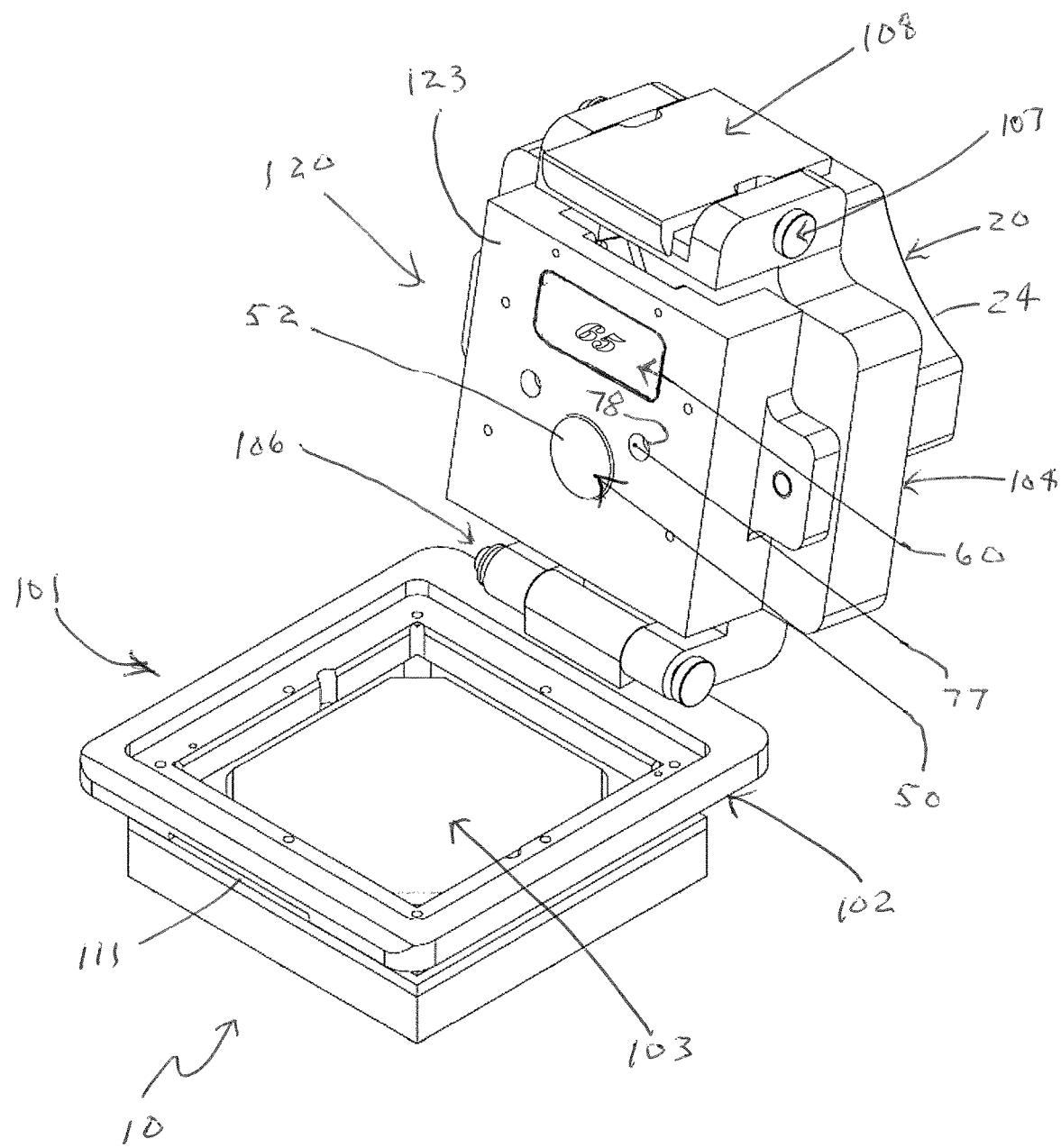
FIG. 1 is a perspective view of an exemplary packaged device adapter apparatus (i.e., in an open state) including a measurement apparatus (e.g., counting components) according to the present disclosure.
Figure 2:
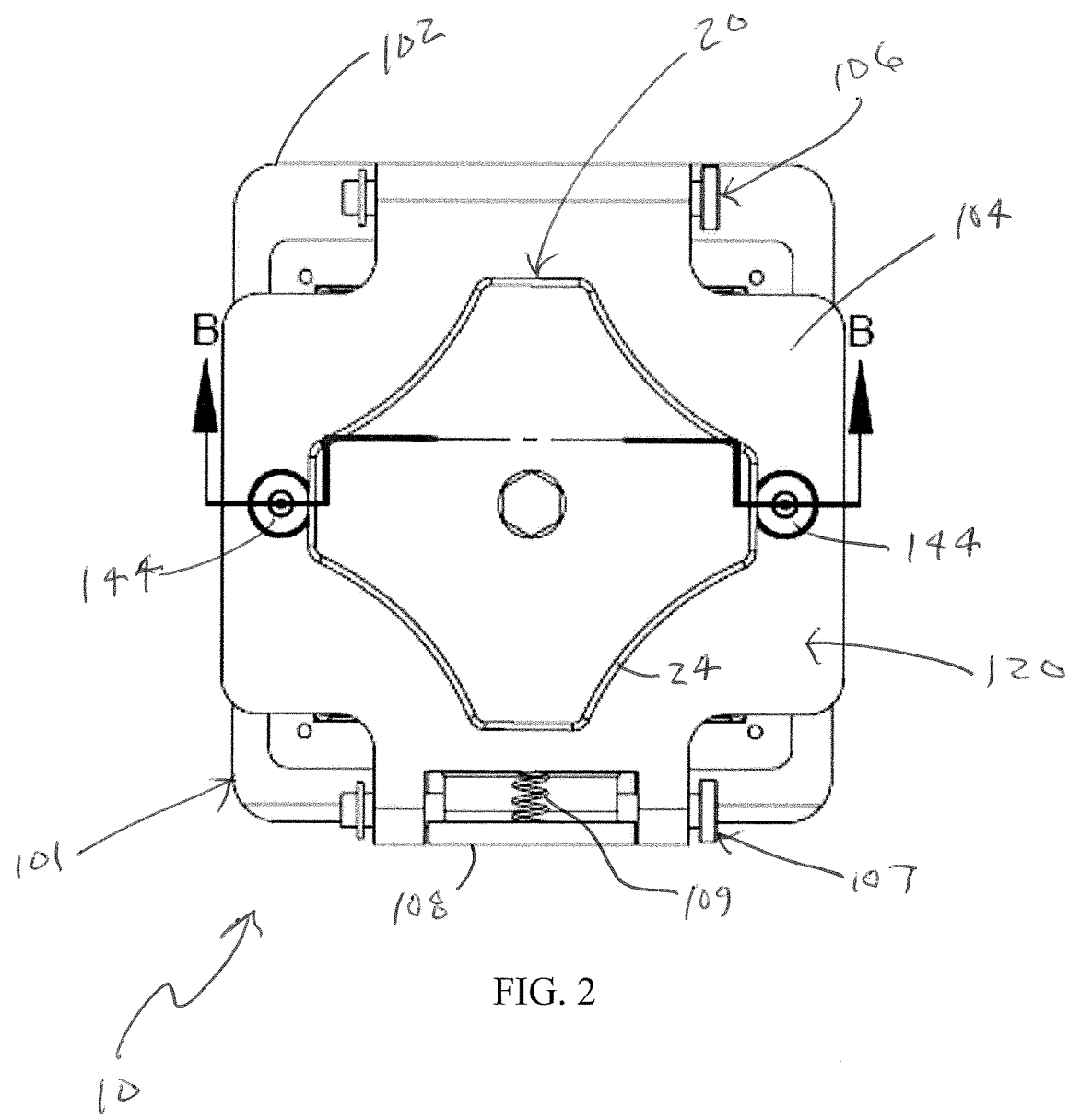
FIG. 2 is a top view of the exemplary packaged device adapter apparatus of FIG. 1.
Figure 3A:
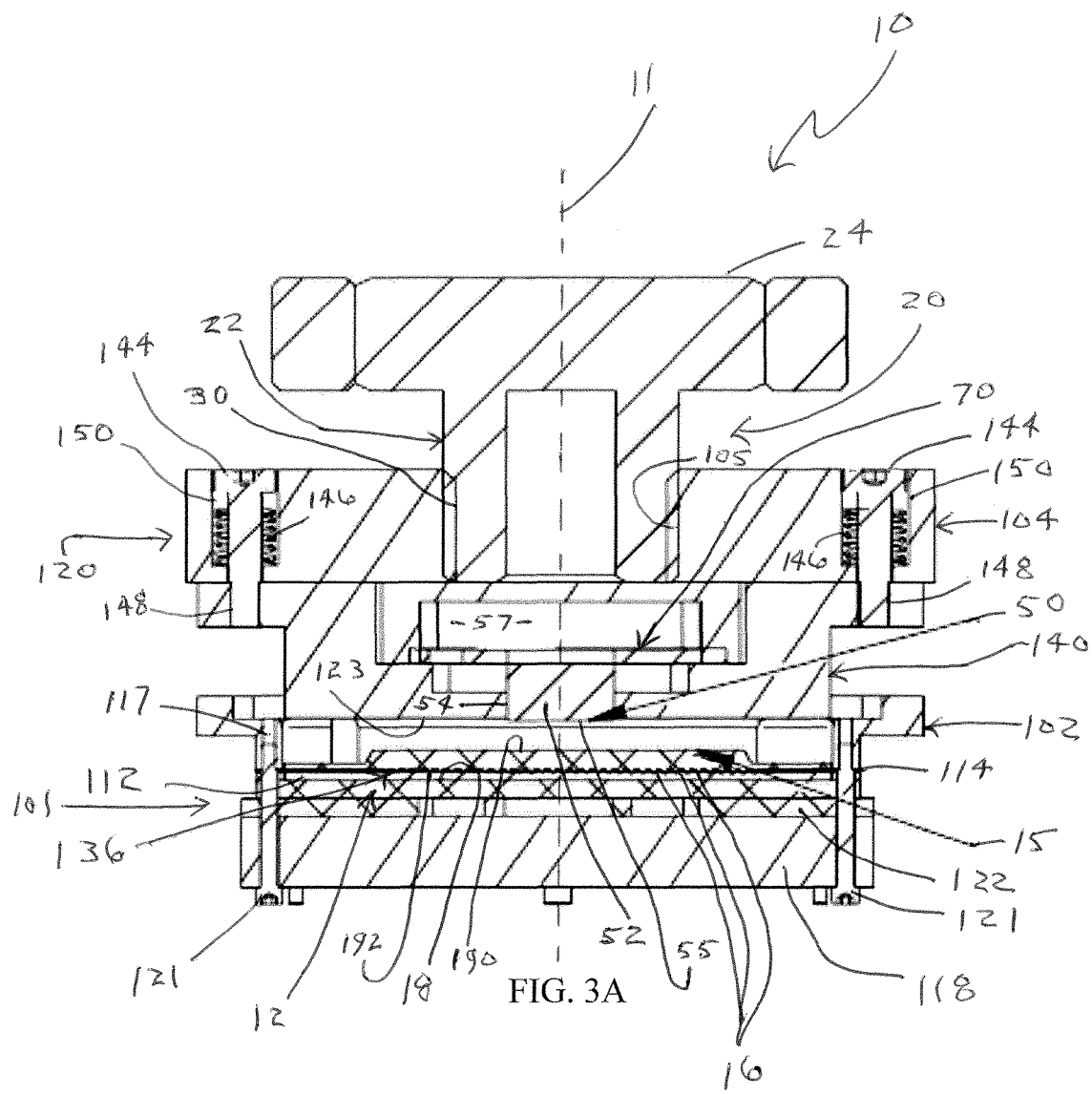
FIGS. 3A and 3B are cross-section views of the exemplary adapter apparatus shown in FIGS. 1-2 taken along line B-B in FIG. 2, in an uncompressed and compressed state, respectively.
Figure 3B:
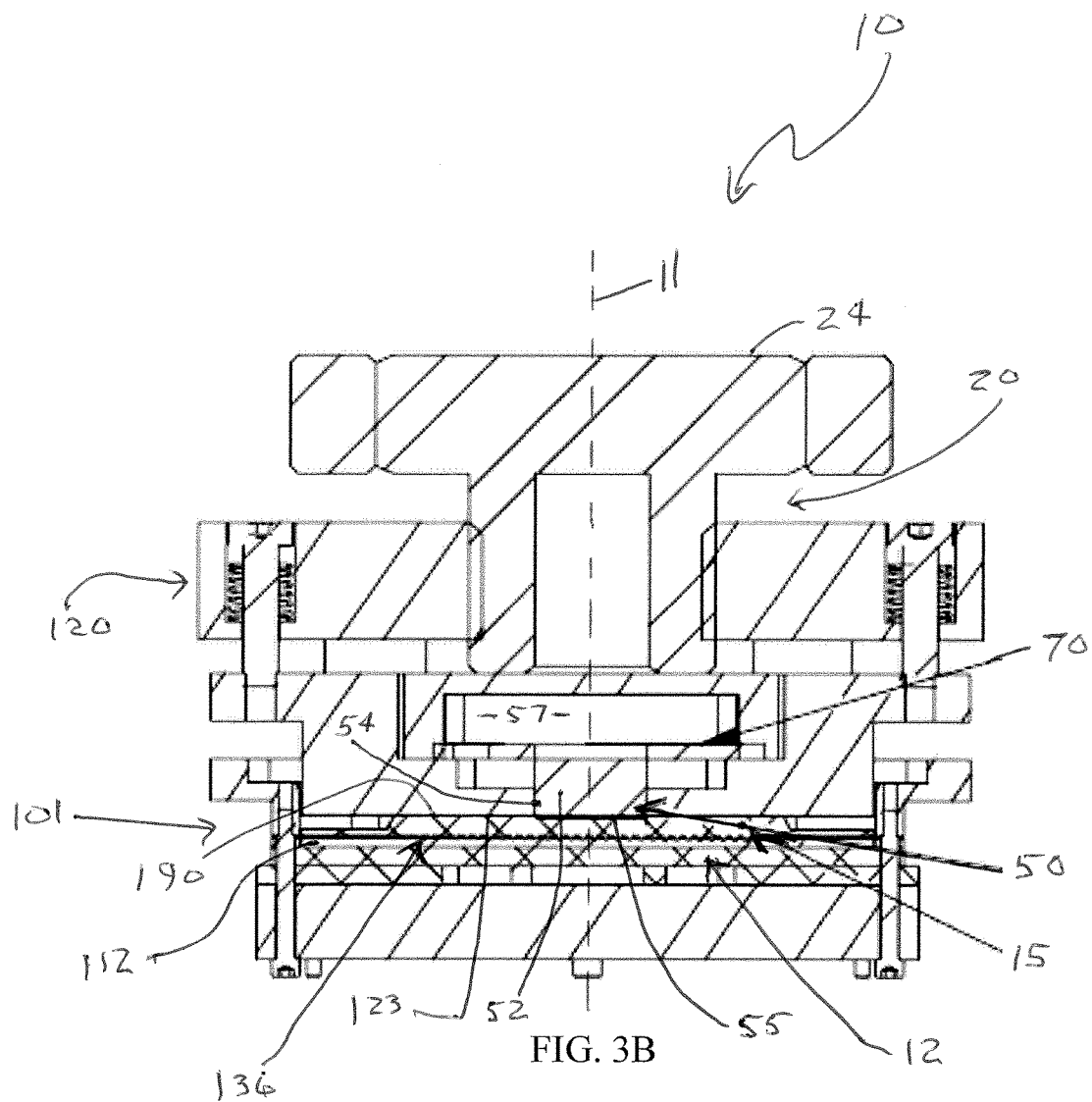

FIG. 1 is a perspective view of an exemplary packaged device adaptor apparatus 10. The exemplary packaged device adaptor apparatus 10 may be mounted relative to a target board 12 (e.g., such as shown in FIG. 3). A top view of the exemplary packaged device adaptor apparatus 10 is shown in FIG. 2. FIGS. 3A and 3B are cross-section views of the exemplary adapter apparatus 10 shown in FIGS. 1-2 taken along line B-B in FIG. 2, in an uncompressed and compressed state, respectively.

The adaptor apparatus 10 is for use with a packaged device 15 (see FIGS. 3A and 3B) having a plurality of contact elements 16 disposed on a surface 192 (e.g., bottom surface) thereof. The adaptor apparatus 10 includes an adaptor body 101 and a socket lid assembly 120. The adaptor body 101 defines a socket cavity 103 configured to receive the packaged device 15 such that, for example, the plurality of contact elements 16 of the packaged device 15 are aligned with arranged conductive elements. For example, the conductive elements may include conductive elements 136 as shown in FIGS. 3A and 3B which form a portion of adaptor apparatus 10. However, the conductive elements may include other elements in one or more other applications as will be apparent from the description herein, such as, for example, an arranged pattern of contacts on a surface (e.g., surface 18 of a target board 12 (see FIGS. 3A and 3B). As shown in FIG. 1, the adapter apparatus is in an open state (e.g., the lid assembly 120 being in an open position such that a packaged device may be received within the socket cavity 103.

The socket lid assembly 120 includes a lid portion 104 and a torque assembly 20 provided for use in applying a force upon the packaged device 15 received in the socket cavity 103 defined by the adaptor body 101. At least one embodiment, the torque assembly 20 includes a threaded interface member 22; the threaded interface member 22 including a threaded portion 30 configured to mate with the threaded opening 105 of the lid portion 104. Further, at least in one embodiment, the torque assembly 20 includes a torque applicator 24 for grasping and applying torque (e.g., the torque applicator 24 being coupled to the threaded interface member 22 such that torque applied to the torque applicator 24 is transferred to the threaded interface member 22 to move the threaded portion 30 thereof into the threaded opening 105 of the lid portion 104. Turning of the torque assembly 20 into the threaded opening 105 assists in asserting a force (e.g., either directly or indirectly) onto packaged device 15 such as, for example, to provide the contact elements 16 of the packaged device 15 into electrical contact with an arrangement of conductive elements (e.g., conductive elements 136, such as elements of a conductive elastomer, pads, etc.) corresponding thereto.

Further, at least in one or more embodiments, the socket lid assembly 120 may include measurement apparatus associated with the lid assembly 120. The measurement apparatus may generally include at least one measurement element that is configured to contact a packaged device 15 received in the socket cavity 103 when the socket lid assembly 120 closes the socket cavity 103 and applies a force upon the packaged device 15. In at least one embodiment, a measurement signal is generated with use of the measurement element that is configured to contact the packaged device 15 when the socket lid assembly 120 is closed and applies force upon the packaged device 15. Still further, in one or more embodiments, the socket lid assembly 120 may include an indication apparatus or an indicator that is configured to display a parameter based on the measurement signal.

For example, as shown in FIGS. 1-3, the measurement apparatus, as further described herein, may include an actuation apparatus 50 associated with the lid assembly 120. The actuation apparatus 50 may be actuated when the socket lid assembly 120 closes the socket cavity 103 and applies a force upon a packaged device 15. An indicator 60 as shown in FIG. 1 may be used to display a count of the number of times the actuation apparatus 50 is actuated.

Figure 5:
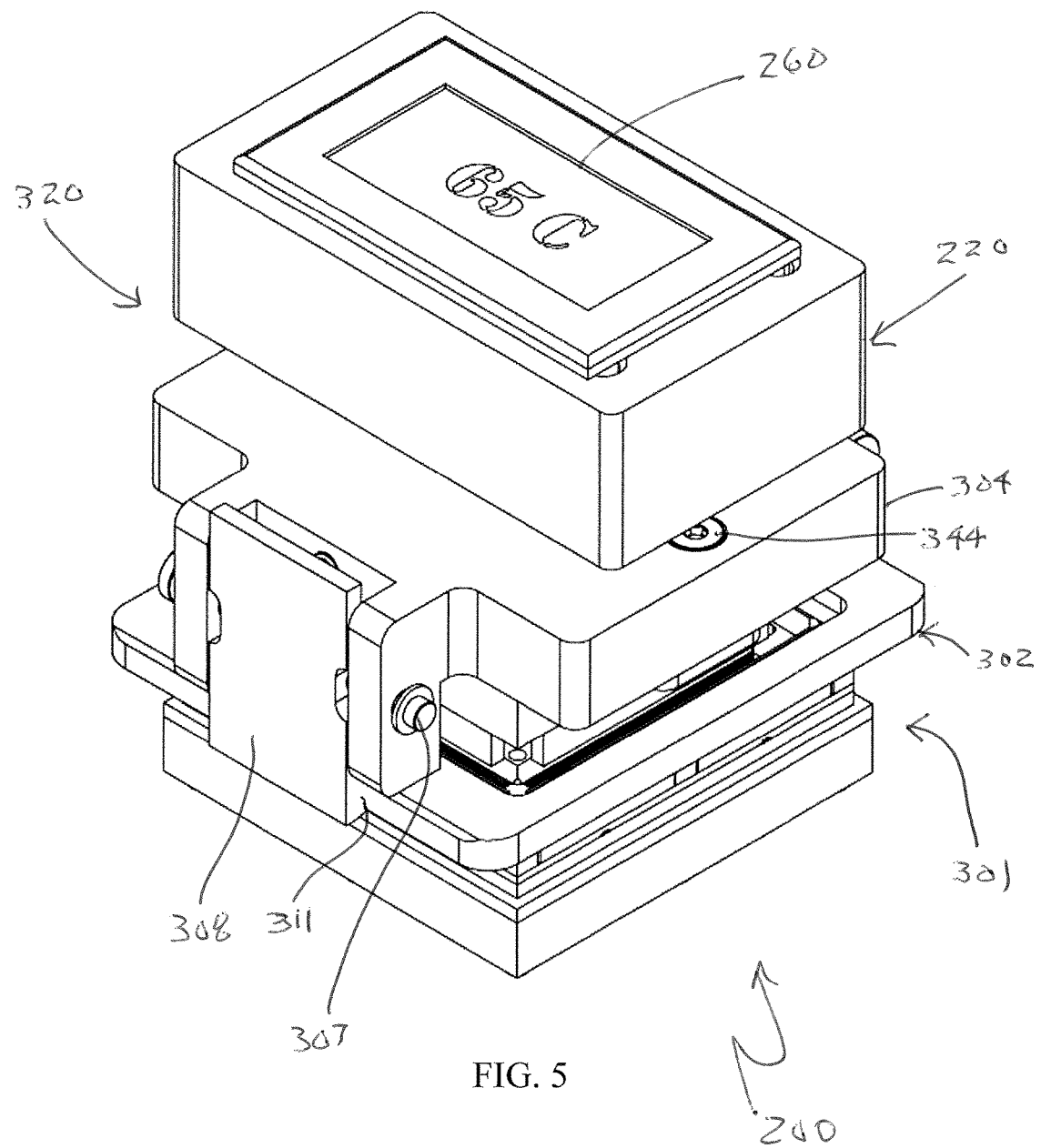
FIG. 5 is a perspective view of another exemplary packaged device adapter apparatus (i.e., in a closed state) including a measurement apparatus (e.g., temperature sensing apparatus) according to the present disclosure.
Figure 6:
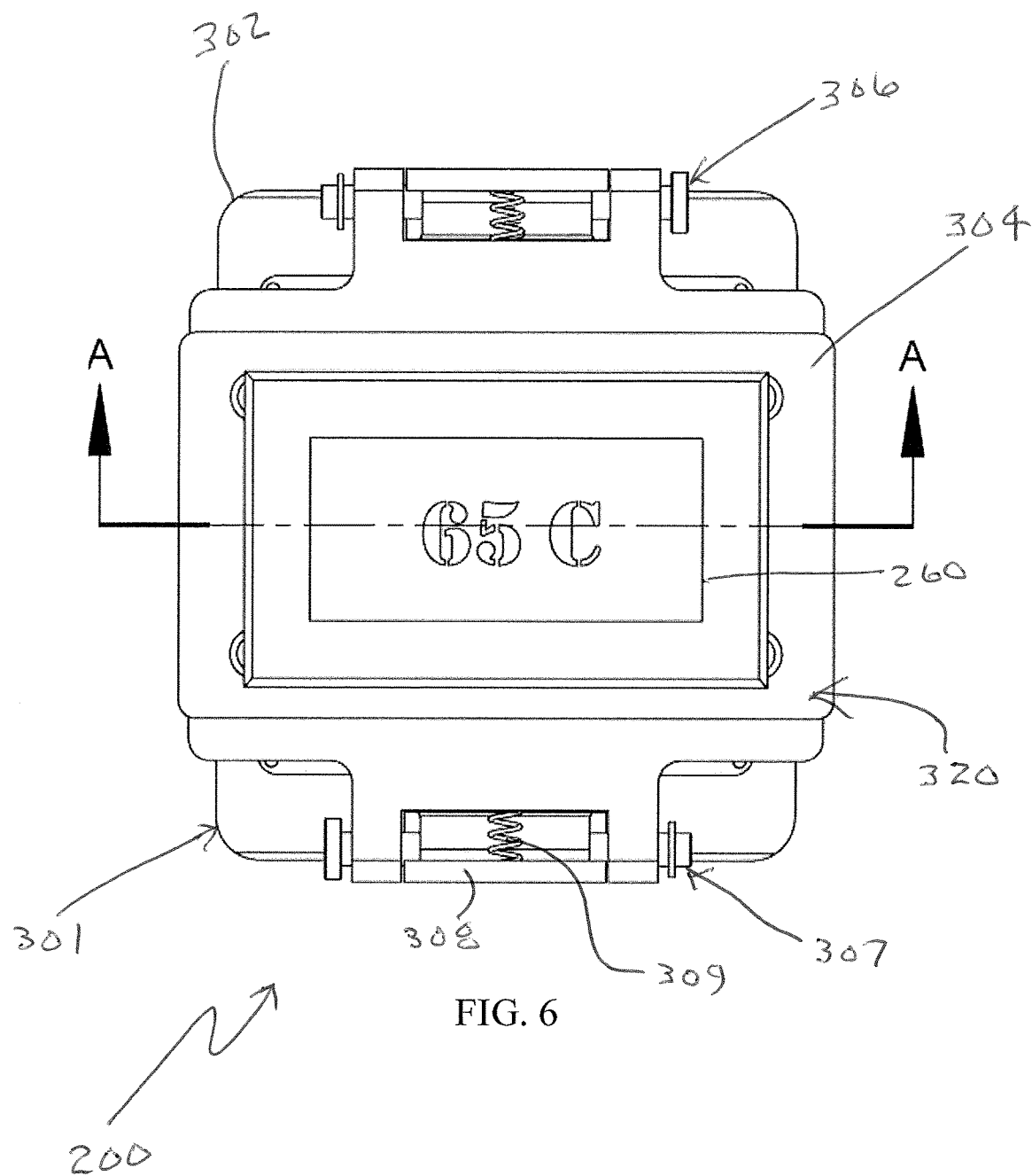
FIG. 6 is a top view of the exemplary packaged device adapter apparatus of FIG. 5.

Further, for example, as shown in FIGS. 5-7, the measurement apparatus, as further described herein, may include a temperature sensing apparatus 250 that includes a sensing element 252 configured to touch a packaged device 15 received in the socket cavity 303 to sense the temperature of the packaged device 15 when the socket lid assembly 320 closes the socket cavity 303 and applies a force upon the packaged device 15. An indicator 260, as shown in FIG. 5, may be configured to display a parameter based on the sensed temperature (e.g., the temperature or a parameter that indicates the temperature is too high).

At least in one embodiment, the components of the adaptor apparatus 10 (e.g., including the socket lid assembly 120 which includes torque assembly 20 and lid portion 104, the adapter body 101, and the socket cavity 103) lie along axis 11. The axis 11 is generally orthogonal, at least in one embodiment, to the target board 12.

The packaged device 15 may be any packaged device having a plurality of contact elements 16 disposed on a surface thereof. In one exemplary embodiment, the packaged device is a device having a high density of contact terminals (e.g., lands, solder spheres, bumps, contact pads, leads, etc.) disposed on the surface thereof. For example, the high density packaged device may be a micro lead frame package, a micro lead chip carrier, a quad flat no-lead package, micro ball grid array package, or any other type of package such as a ball grid array package, a chip scale package, a flip chip package, a flat package, a quad flat package, a small outline package, a land grid array package, or any other package having contact elements disposed on a surface thereof. Although one packaged device 15 is shown in the figures, the present disclosure is in no manner limited to the use of the illustrative adaptor apparatus embodiments described herein with packages that are configured in such a manner. Rather, adaptor apparatus which employ features as described herein may be used with any packaged device having contact elements disposed on a surface thereof.

In one embodiment, as shown in FIGS. 3A and 3B, packaged device 15 includes an upper surface 190 and the lower surface 192, in addition to one or more side surfaces extending therebetween at the perimeter of the packaged device 15. The plurality of contact elements 16 are disposed at least at the lower surface 192. For example, the contact elements 16 may be distributed in an array along orthogonal X and Y axes, or the contact elements (e.g., lands) may be distributed along the outer portions of the lower surface 192 proximate the perimeter thereof. However, any arrangement of contact elements 16 may be accommodated.

The adaptor body 101 may be provided by any number of components that define the socket cavity 103 configured to receive the packaged device 15 therein and the socket lid assembly 120 may be provided by any number of components that are configured to close the socket cavity 103 and apply a force to a packaged device received therein. In at least one or more embodiments, the packaged device is received within the socket cavity 103 such that the plurality of contact elements 16 of the packaged device 15 are aligned with arranged conductive elements corresponding thereto (e.g., pads of a target board, conductive elastomer elements, etc.). Apart from being operable to receive the packaged device 15 in the socket cavity, the configuration of the adaptor body 101 may take any number of forms. Apart from being able to close the socket cavity and apply a force upon the packaged device, the socket lid assembly may take any number of forms. For example, the adaptor body and the socket lid assembly may include elements such as those found in U.S. Pat. No. 7,565,843, U.S. Pat. No. 6,533,589, U.S. Pat. No. 6,394,820, U.S. Pat. No. 5,791,914, U.S. Pat. No. 4,460,223, U.S. Pat. No. 5,892,245, and/or U.S. Pat. No. 5,730,620. For example, such adaptor bodies may be configured for receiving a packaged device 15 to be located or aligned with contact pads on a target board, may be configured for receiving a packaged device such that the contact elements 16 thereof are positioned adjacent a conductive elastomer, or may include, for example, a clamshell socket body or pogo pin socket as shown and described generally herein with reference to the figures.

As shown in FIGS. 1-3, the adaptor body 101 (e.g., a part of a clamshell socket) includes a socket base 102 defining at least a part of the socket cavity 103 configured to receive a packaged device 15. The socket lid assembly 120 used to close the socket cavity 103 is hinged to the socket base 102 using a hinge pin or pins 106.

Further, as shown in FIGS. 1-3, the adaptor apparatus 10 may include a latch mechanism for latching the socket lid assembly 120 to the socket base 102. In one embodiment, the latch mechanism may include a latch element 108 connected to the lid portion 104 using a latch spring 109 (see FIG. 2) and a hinge pin and snap ring 107. The latch element 108 engages the socket base 102 at indent 111 achieving a closed state (e.g., a latched state).

The exemplary adaptor shown in FIGS. 1-3 may further include various components. For example, the adaptor apparatus 10 may include a structure 112 for providing an arrangement of pins 136 (e.g., pogo pins) corresponding to the plurality of contact elements 16 of the packaged device 15 to which they are to be electrically connected. A pin and ball guide top layer 114 may be provided to guide the packaged device 15 and align the packaged device 15 to the arranged conductive elements 136 (e.g., pins, elements of an elastomer, etc.). Pin guide screws (not shown) may be provided for holding the arrangement of conductive elements 136 in position, and dowel pins 117 may be provided for the socket base 102 to align the conductive element containing structure 112 relative thereto. Further, an insulation plate 122, a backing plate 118, and socket base screws 121 are provided for mounting the adaptor body 101 relative to the target board 12 (e.g., a printed circuit board).

As previously described herein, the components forming the adaptor body 101 may take one of various different forms, and any particular listing and/or provision of description herein with respect to a particular adaptor body is not to be construed as limiting to the present disclosure. Further, for example, the arrangement of conductive elements to which the contact elements 16 of the packaged device are aligned and provided in electrical contact with by use of the socket lid assembly 120, may take one of various different types or forms. For example, the arrangement of conductive elements may be provided by a conductive elastomer layer, a pin arrangement structure, a socket arrangement structure, or any other arrangement of conductive elements as would be known to one skilled in the art.

Further, in one or more embodiments, the socket lid assembly 120 may include one or more various additional components. For example, a compression plate 140 may be provided for transferring the force from the threaded interface member 22 to the packaged device 15. However, such force may be applied directly from the threaded interface member 22 to the packaged device 15. In one or more embodiments, the compression plate 140 may provide for a more distributed force on the packaged device 15, and thus be advantageous.

The compression plate 140 of the socket lid assembly 120 may either be a floating compression plate upon which the threaded interface member 22 makes contact, or the compression plate 140 may be movably coupled to the socket lid assembly 120, such as lid portion 104, or any other component thereof. For example, as shown in FIGS. 1-3, the compression plate 140 includes threaded openings 148 for mating with clamshell screws 144 inserted within openings 150 of lid portion 104 to mount the compression plate 140 relative to the socket lid portion 104. Clamshell screw springs 146 allow for the effective transmission of force from the threaded interface member 22 to the compression plate 140 when the compression plate 140 is mounted to the socket lid portion 104.

As previously described herein, the components forming the socket lid assembly 120 may take one of various different forms, and any particular listing and/or provision of description herein with respect to a particular socket lid assembly is not to be construed as limiting to the present disclosure.

One or more embodiments of the adapter apparatus 10 shown in FIGS. 1-4 may be used to solve one or more issues relating to packaged device (e.g., semiconductor device) testing. For example, in a semiconductor test, accuracy is critical. To test without permanently connecting the packaged device 15 (e.g., a chip) to a target board 12, socket type adapter apparatus, such as adapter apparatus 10, are used as interconnect material. Such socket type adapter apparatus may include an interface contact element structure (e.g., such as the arrangement of conductive elements 136 and the conductive element containing structure 112) which interfaces the packaged device 15 to the target board 12. Such an interface structure may degrade over usage. As such, socket type adapter apparatus may be rated for 2K to 500K cycles. However, measurement of the number of cycles which the interface contact element structure undergoes many difficult. Adapter apparatus 10 shown in FIGS. 1-4 includes an electronic insertion counter to provide such a measurement (e.g., count the number of times a packaged device 15 is compressed against the interface contact element structure providing for electrical connection of the packaged device as desired by the user).

To implement such an electronic insertion counter (e.g., a measurement apparatus), the adapter apparatus 10 includes an actuation apparatus 50 associated with the socket lid assembly 120, counter circuitry 70, and indicator 60. The actuation apparatus 50 may be any apparatus that may be actuated when the socket lid assembly 120 closes the socket cavity 103 and applies a force upon the packaged device 15. For example, the actuation apparatus 50 may include a compressible element located at a surface of the socket lid assembly 120 that is actuated upon contact with the packaged device 15 when the socket lid assembly 120 closes socket cavity 103 and applies a force upon the packaged device 15. For example, the compressible element may be a spring-loaded element that produces a count or increment signal by closing a conductive path, may be a deflection element that produces a count or increment signal upon deflection, or may be any other actuator that upon contact with the packaged device 15 results in a measurement signal that increments a count of counter circuitry 70.

Figure 4:
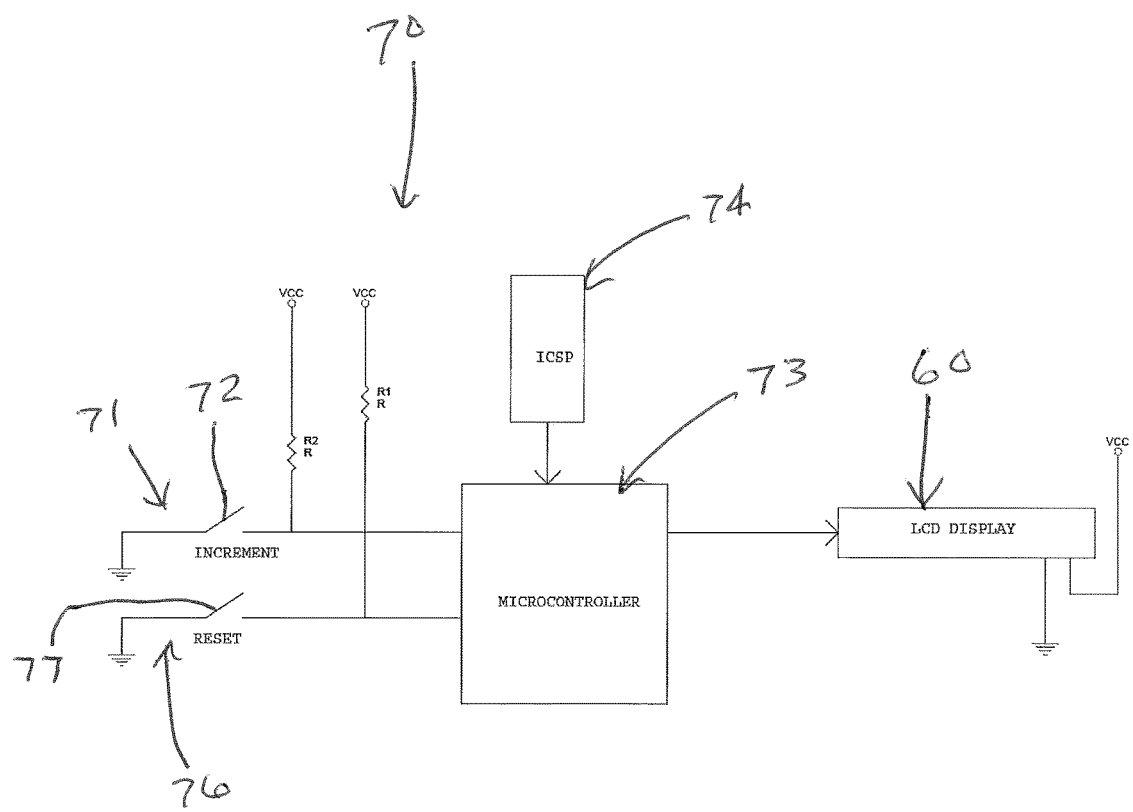
FIG. 4 is an exemplary embodiment of counter circuitry that may be integrated into the socket lid assembly of the adapter apparatus shown in FIGS. 1-3.

For example, as shown in FIGS. 1-3, the socket lid assembly 120 includes a lower surface 123. When the socket lid assembly 120 is closed (e.g., latched) the lower surface 123 faces towards the packaged device 15 and/or towards the socket cavity 103. More specifically, the compression plate 140 includes the lower surface 123. At least in one embodiment, as shown in FIGS. 1-3, the lower surface 123 is used to provide a force onto the packaged device 15 such that the plurality of contact elements 16 of the packaged device 15 are electrically connected to the conductive elements 136. The actuation apparatus 50, for example, as shown in FIGS. 1-3, includes a pushbutton 52 that extends through an opening 54 in compression plate 140 (e.g., the opening 54 terminating at the lower surface 123 thereof). The pushbutton 52 terminates at a surface 55 thereof exposed at the lower surface 123 such that when the socket lid assembly 120 closes the socket cavity 103 and the compression plate 140, via surface 123, applies a force upon packaged device 15, the surface 55 of the pushbutton 52 contacts the packaged device 15 and is actuated (e.g., an increment count line to a microcontroller is closed as shown in FIG. 4). For example, the pushbutton 52 is deflected by the packaged device 15 into a void space 57 within compression plate 140.

For example, as shown in FIG. 3A, the pushbutton 52 is in an uncompressed state, wherein a gap exists between surface 55 of the pushbutton 52 and the upper surface 190 of the packaged device 15. Further, for example, as shown in FIG. 3B, the pushbutton 52 is in a compressed state (e.g., such that a counter is incremented), wherein surface 55 of the pushbutton 52 is in contact with the upper surface 190 of the packaged device 15.

One skilled in the art will recognize that any actuation apparatus or configuration thereof, such as, for example, compressible actuators, spring-loaded actuators, rubber actuators, or the like, may be used to provide a measurement signal to counter circuitry 70. As such, the present disclosure is not limited to any particular type of actuator, but at least in one embodiment, actuation thereof provides a measurement signal indicating a count should be incremented.

Counter circuitry 70 may be any suitable circuitry for providing a counting function and generating an output for use by indicator 60. Such counter circuitry 70 may be implemented with the use of microprocessors, microcontrollers, analog circuitry, digital circuitry, and/or any hardware/software necessary to provide the functionality described herein. For example, as shown in FIG. 4, one embodiment of the counter circuitry 70 may include an increment line 71 with an actuation switch 72 operated in conjunction with an actuator, such as, for example, pushbutton 52. For example, the increment line 71 upon actuation of the actuator apparatus 50 (e.g., closing of switch 72) provides a count signal to microcontroller 73. Microcontroller 73 is programmed via the in circuit serial programmer 74 to count the actuations occurring in an incremental manner. In other words, each time an actuation occurs using, for example, the pushbutton 52, the microcontroller 73 increments the count. The microcontroller 73 may then provide a count parameter for display on indicator 60.

For example, in one or more embodiments, the count parameter may be a count of the number of times the actuation apparatus is actuated, the count parameter may be an indication that a certain count (e.g., count of cycles) has been reached, and/or any other count parameter based on the incremented count that may be beneficial to a user.

The indicator 60 may be any indicator suitable for providing a usable parameter to a user. For example, indicator 60 may be any suitable display, such as, for example, an LCD display, a mechanical rotary counter display for each digit, or the like.

The indicator 60, at least in one embodiment, is integrated into the socket lid assembly 120. For example, the indicator 60 may be a display viewable only when the socket lid assembly 120 is in an open state such that a packaged device may be received within the socket cavity 130. For example, as shown in FIG. 1, the display 60 is located (e.g., recessed in) at the lower surface 123 of the compression plate 140. However, the display 60 may be located at any other portion of the socket lid assembly 120, such as at a position that may be viewable when the socket lid assembly 120 is in a closed state (e.g., is latch and the socket lid assembly 120 covers the socket cavity 130). For example, display 60 may be located within the adapter apparatus 10, or on the top or side of the adapter apparatus 10 (e.g., socket lid assembly or adapter body).

Further, counter circuitry 70 may include a reset line 76 connected to the microcontroller 73 that includes a reset switch 77. At least in one embodiment, activation of the reset switch 77 resets the incremented count provided by the microcontroller 73 as driven by the actuation of increment line 71. For example, the reset switch 77 may reset the incremented count to zero. For example, if the interface contact element structure is replaced within the adapter apparatus 10, the user may reset the incremented count to zero. The reset switch 77 may be implemented in any suitable manner using an actuatable element. For example, as shown in FIG. 1, a reset switch 77 is provided within an opening 78 that terminates at the lower surface 123. For example, a pushbutton switch or any other suitable switch may be located within the opening and a user may activate the switch using an object insertable into the opening 78 at the lower surface 123.

At least in one embodiment, the counter circuitry 70 is integrated into the socket lid assembly 120. For example, the counter circuitry 70 may be located within the void 57 of the compression plate 140 (e.g., allowing easy connection to the display indicator 60 and the actuation apparatus 50, as well as the reset switch 77). However, the counter circuitry 70 may be located or positioned at any other portion of the socket lid assembly 120.

As such, and in operation, a method of testing packaged devices is provided using one or more embodiments of the adapter apparatus 10 described herein. For example, the method or operation may include positioning a packaged device 15 in the socket cavity 103, closing the socket lid assembly 120 to apply a force upon the packaged device 15 received in the socket cavity 130 of the adapter body 101 such that the plurality of contact elements of the packaged device 16 are electrically connected to conductive elements corresponding thereto. A counter is incremented upon closing of the socket lid assembly 120 and application of a force upon the packaged device 15 received in the socket cavity 103 of the adapter body 101. This process may be repeated for one or more additional packaged devices resulting in additional incremented counts. During the testing of one or more packaged devices, a count based on the incremented counter may be displayed, for example, using indicator 60 (e.g., "65" is displayed as an example on the indicator 60 of FIG. 1). A user may also reset the incremented counter, using, for example, reset switch 77.

In other words, at least in one or more embodiments, the electronic insertion counter may be integrated into the socket lid assembly 120. A pushbutton may be exposed on the compression plate 140 which compresses the packaged device 15 onto the target board 12 via interface conductive elements. At least in one or more embodiments, every time a packaged device is compressed, the pushbutton is actuated which in turn activates the counter circuitry 70 integrated into the socket lid assembly 120. Such actuations (e.g., activations) are counted by the counter circuitry 70 and may be displayed by the indicator 60 (e.g., an LCD display). For example, if an interface conductive element structure is rated for 2K insertions, then after 2K insertions are measured in accordance with the features described herein, the interface conductive element structure may be replaced. The counter circuitry can then be reset to count from zero (e.g., "0" may be displayed on the indicator 60).

Figure 7A:
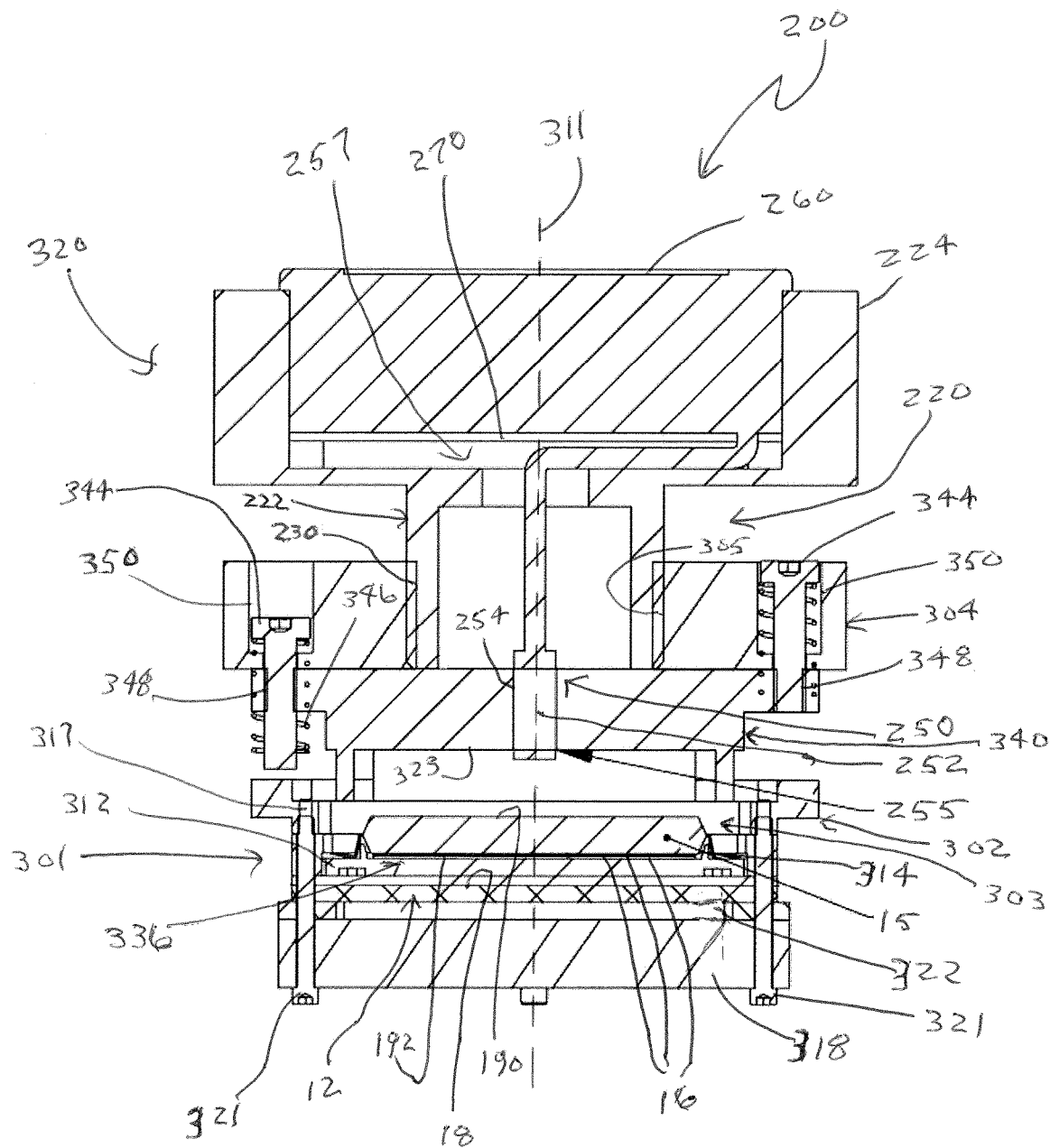
FIGS. 7A and 7B are cross-section views of the exemplary adapter apparatus shown in FIGS. 5-6 taken along line A-A in FIG. 6, in an open position (e.g., uncompressed) and a closed position (e.g., compressed state), respectively.
Figure 7B:
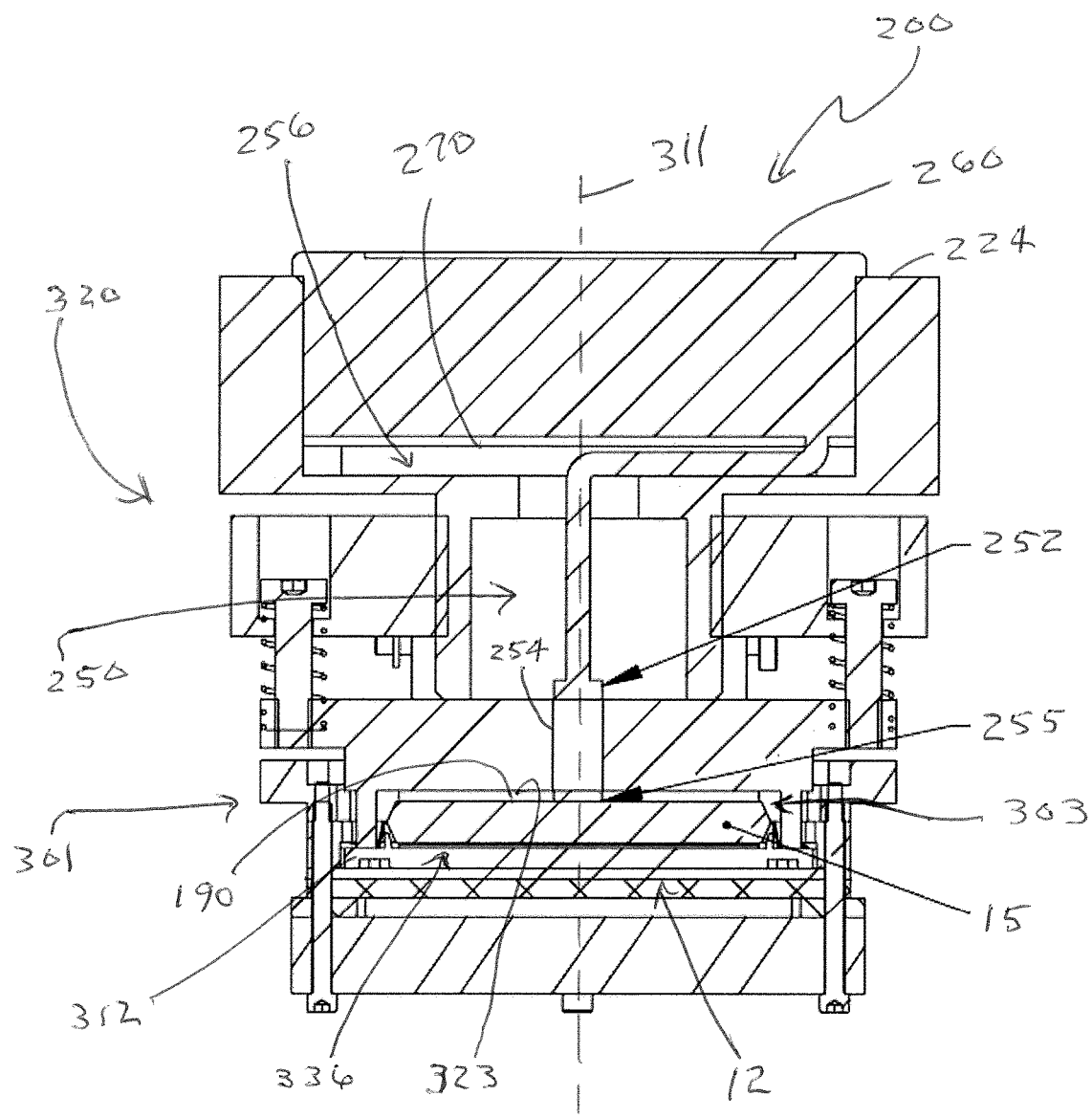

A perspective view of another embodiment of an exemplary packaged device adaptor apparatus 200 that includes temperature monitoring is shown in FIG. 5. The exemplary packaged device adaptor apparatus 200 may be mounted relative to a target board 12 (e.g., such as shown in FIG. 7). A top view of the exemplary packaged device adaptor apparatus 200 is shown in FIG. 2. FIGS. 7A and 7B are cross-section views of the exemplary adapter apparatus 200 shown in FIGS. 5-6 taken along line A-A in FIG. 6, in an open and closed position or state, respectively.

The adaptor apparatus 200 is for use with a packaged device 15 (see FIGS. 7A and 7B) having a plurality of contact elements 16 disposed on a surface 192 (e.g., bottom surface) thereof. The adaptor apparatus 200 includes an adaptor body 301 and a socket lid assembly 320. The adaptor body 301 defines a least part of a socket cavity 303 (see FIG.

7) configured to receive the packaged device 15 such that, for example, the plurality of contact elements 16 of the packaged device 15 may be aligned with arranged conductive elements. For example, the conductive elements may include conductive elements 336 as shown in FIGS. 7A and 7B which may form a portion of adaptor apparatus 200. However, the conductive elements may include other elements in one or more other applications as will be apparent from the description herein, such as, for example, an arranged pattern of contacts on a surface (e.g., a surface 18 of a target board 12). As shown in FIG. 5, the adapter apparatus 200 is in a closed state (e.g., the lid assembly 320 is in a closed position such that the socket lid assembly 320 closes the socket cavity 303 and applies a force to a packaged device 15 received within the socket cavity 303).

The socket lid assembly 320 includes a lid portion 304 and a torque assembly 220 provided to assist in applying a force upon the packaged device 15 received in the socket cavity 303 defined by the adaptor body 301. In at least one embodiment, the torque assembly 220 includes a threaded interface member 222; the threaded interface member 222 including a threaded portion 230 configured to mate with the threaded opening 305 of the lid portion 304. Further, at least in one embodiment, the torque assembly 220 includes a torque applicator 224 for grasping and applying torque (e.g., the torque applicator 224 being coupled to the threaded interface member 222 such that torque applied to the torque applicator 224 is transferred to the threaded interface member 222 to move the threaded portion 230 thereof into the threaded opening 305 of the lid portion 304. Turning of the torque assembly 220 into the threaded opening 305 may assist in asserting a force (e.g., either directly or indirectly) onto packaged device 15 such as, for example, to provide the contact elements 16 of the packaged device 15 into electrical contact with an arrangement of conductive elements (e.g., conductive elements 336, elements of a conductive elastomer, etc.) corresponding thereto.

In one embodiment, the components of the adaptor apparatus 200 (e.g., including the socket lid assembly 320 which may include torque assembly 220 and lid portion 304, the adapter body 301, and the socket cavity 303) may lie along axis 311. The axis 311 is generally orthogonal, at least in one embodiment, to the target board 12.

The packaged device 15 may be any packaged device such as described with reference to FIGS. 1-3, for example, as shown in FIGS. 7A and 7B, packaged device 15 includes an upper surface 190 and the lower surface 192, in addition to one or more side surfaces extending therebetween at the perimeter of the packaged device 15. The plurality of contact elements 16, for example, may be disposed at least at the lower surface 192.

Substantially as described with reference adapter body 101 and socket lid assembly 120, the adaptor body 301 may be provided by any number of components that define the socket cavity 303 configured to receive the packaged device 15 therein and the socket lid assembly 320 may be provided by any number of components that are configured to close the socket cavity 303 and apply a force to a packaged device received therein.

As shown in FIGS. 5-7, the adaptor body 301 (e.g., a part of a clamshell socket) includes a socket base 302 defining at least a part of the socket cavity 303 therein configured to receive a packaged device 15. The socket lid assembly 320 used to close the socket cavity 303 may be hinged to the socket base 302 using a hinge pin or pins 306. However, as shown in FIGS. 5-7, the adaptor apparatus 200 may include a latch mechanism on opposing sides of the adaptor apparatus 200 for latching the socket lid assembly 320 to the socket base 302. In one embodiment, the latch mechanism may include a latch element 308 connected to the lid portion 304 using a latch spring 309 (see FIG. 6) and a hinge pin and snap ring 307. The latch element 308 engages the socket base 302 at indent 311 achieving a closed and latched state.

The exemplary adaptor apparatus 200 shown in FIGS. 5-7 may further include various components. For example, the adaptor apparatus 200 may include a structure 312 for providing an arrangement of pins 336 (e.g., pogo pins) corresponding to the plurality of contact elements 16 of the packaged device 15 to which they are to be electrically connected. A pin and ball guide top layer 314 may be provided to guide the packaged device 15 and align the packaged device 15 to the arranged conductive elements 336 (e.g., pins, elements of an elastomer, etc.). Pin guide screws (not shown) may be provided for holding the arrangement of conductive elements 336 in position, and dowel pins 317 may be provided for the socket base 302 to align the conductive element containing structure 312 relative thereto. Further, an insulation plate 322, a backing plate 318, and socket base screws 321 may be provided for mounting the adaptor body 301 relative to the target board 12 (e.g., a printed circuit board).

As previously described herein, the components forming the adaptor body 301 may take one of various different forms, and any particular listing and/or provision of description herein with respect to a particular adaptor body is not to be construed as limiting to the present disclosure. Further, for example, the arrangement of conductive elements to which the contact elements 16 of the packaged device are aligned and provided in electrical contact with by use of the socket lid assembly 320, may take one of various different types or forms. For example, the arrangement of conductive elements may be provided by a conductive elastomer layer, a pin arrangement structure, a socket arrangement structure, or any other arrangement of conductive elements as would be known to one skilled in the art.

Further, in one or more embodiments, the socket lid assembly 320 may include one or more various additional components. For example, a compression plate 340 may be provided for transferring the force from the threaded interface member 222 to the packaged device 15. However, such force may be applied directly from the threaded interface member 222 to the packaged device 15. In one or more embodiments, the compression plate 340 may provide for a more distributed force on the packaged device 15, and thus be advantageous.

The compression plate 340 of the socket lid assembly 320 may either be a floating compression plate upon which the threaded interface member 222 makes contact, or the compression plate 340 may be movably coupled to the socket lid assembly 320, such as lid portion 304, or any other component thereof. For example, as shown in FIGS. 5-7, the compression plate 340 includes threaded openings 348 for mating with clamshell screws 344 inserted within openings 350 of lid portion 304 to mount the compression plate 340 relative to the socket lid portion 304. Clamshell screw springs 346 allow for the effective transmission of force from the threaded interface member 222 to the compression plate 340 when the compression plate 340 is mounted to the socket lid portion 304.

As previously described herein, the components forming the socket lid assembly 320 may take one of various different forms, and any particular listing and/or provision of description herein with respect to a particular socket lid assembly is not to be construed as limiting to the present disclosure.

Further, one or more embodiments of the adapter apparatus 200 shown in FIGS. 5-8 may be used to solve one or more issues relating to the functionality of the packaged device (e.g., semiconductor device) under test (e.g., a temperature or other measurable parameter or characteristic of the packaged device a user may desire may be measured, such as force, etc.). For example, in a semiconductor test, packaged device 15 (e.g., a chip) functioning may be affected by the temperature of the packaged device 15. For example, when the packaged devices operate at a certain power, heat is generated. If heat is not properly dissipated, the packaged device functionality may be in error. Such that heat may be properly dissipated, it is important to have an accurate measurement of the temperature of the packaged device 15. The apparatus 200 shown in FIGS. 5-8 includes electronic temperature monitoring to provide such a temperature measurement (e.g., the temperature of a packaged device 15 is measured using a sensing element in contact with the packaged device 15).

To implement such electronic temperature measurement, the adapter apparatus 200 includes a temperature sensing apparatus 250 associated with the socket lid assembly 320, temperature measurement circuitry 270, and indicator 260. The temperature sensing apparatus 250 may be any measurement element suitable for sensing temperature of the packaged device 15 when the socket lid assembly 320 closes the socket cavity 303 and applies a force upon the packaged device 15. For example, the measurement element may include a temperature sensor located at a surface of the socket lid assembly 320 that comes into contact with the packaged device 15 when the socket lid assembly 320 closes socket cavity 303 and applies a force upon the packaged device 15. For example, the temperature sensor may be a thermocouple for use in generating a measurement signal representative of the temperature of the packaged device 15, may be a temperature sending pad that changes color due to heat, or may be any other transducer suitable to generate a measurement signal representative of the temperature of the packaged device 15 for use, for example, by signal processing circuitry to drive an indicator (e.g., display, color, etc.).

Figure 8:
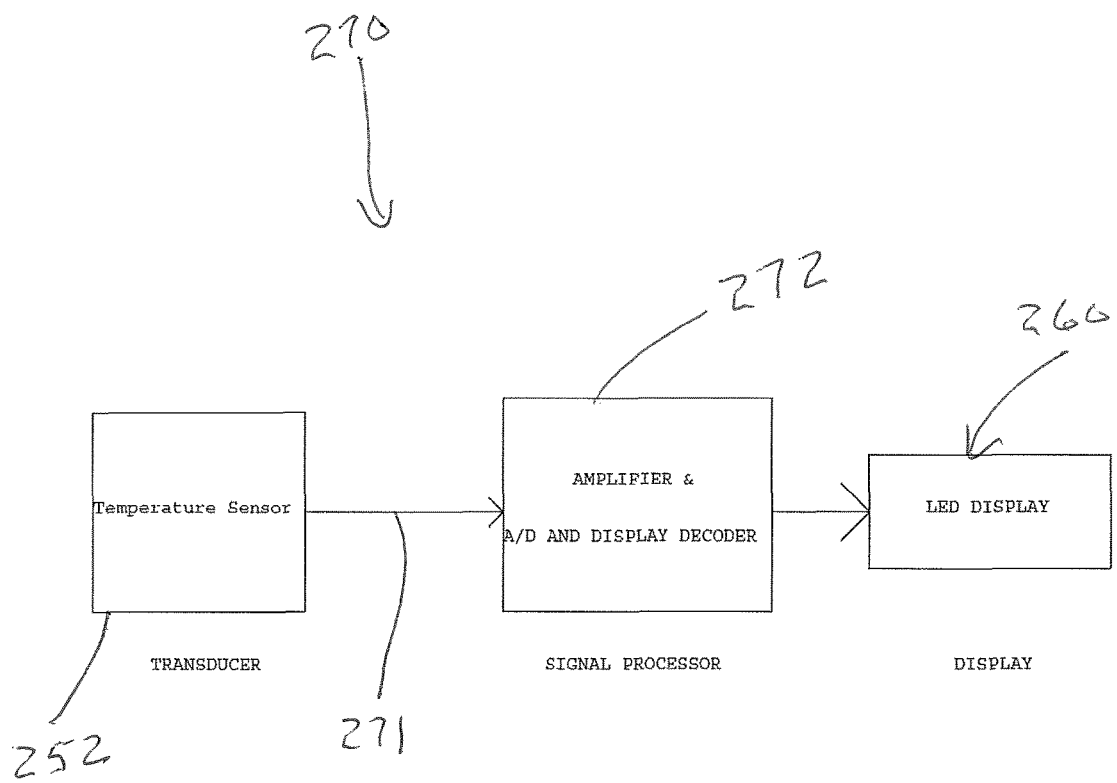
FIG. 8 is an exemplary embodiment of temperature sensing and display circuitry that may be integrated into the socket lid assembly of the adapter apparatus shown in FIGS. 5-7.

For example, as shown in FIGS. 5-7, the socket lid assembly 320 includes a lower surface 323. When the socket lid assembly 320 is closed (e.g., latched) the lower surface 323 faces towards the packaged device 15 and/or towards the socket cavity 303. More specifically, the compression plate 340 includes the lower surface 323. At least in one embodiment, as shown in FIGS. 5-7, the lower surface 323 is used to provide a force onto the packaged device 15 such that the plurality of contact elements 16 of the packaged device 15 are electrically connected to the conductive elements 336. The temperature sensing apparatus 250, for example, as shown in FIGS. 5-7, includes a thermocouple 252 that extends through an opening 254 in compression plate 340 (e.g., the opening 254 terminating at the lower surface 323 thereof). The thermocouple 252 terminates at a sensing end surface 255 exposed at the lower surface 323 such that when the socket lid assembly 320 closes the socket cavity 303 and the compression plate 340, via surface 323, applies a force upon packaged device 15 the surface 255 of the thermocouple 252 contacts the packaged device 15 and senses temperature of the packaged device 15 (e.g., a transducer measurement signal is provided to signal processing circuitry as shown in FIG. 8).

For example, as shown in FIG. 7A, the thermocouple 252 is in an open position, wherein a gap exists between sensing end surface 255 of the thermocouple 252 and the upper surface 190 of the packaged device 15. Further, for example, as shown in FIG. 7B, the thermocouple 252 is in a closed state (e.g., such that a temperature measurement signal is provided for use in driving a temperature display), wherein surface 255 of the thermocouple 252 is in contact with the upper surface 190 of the packaged device 15. The thermocouple 252 may be configured to be deflectable or spring loaded (e.g., movable within the opening 254 as pressure is applied to the device under test 15 when surface 255 contact the device 15). As such, a proper contact pressure may be achieved for providing an accurate temperature measurement signal.

Temperature measurement circuitry 270 may be any suitable circuitry for providing a temperature sensing function and generating an output for use by indicator 260. Such temperature measurement circuitry 270 may be implemented with the use of microprocessors, microcontrollers, analog circuitry, digital circuitry, and/or any hardware/software necessary to provide the functionality described herein. For example, as shown in FIG. 8, one embodiment of the temperature measurement circuitry 270 may include a measurement signal line 271 for providing a temperature measurement signal to signal processing circuitry 272 from temperature sensing apparatus 250 (e.g., a transducer, such as thermocouple 252). Signal processing circuitry 272 may include an amplifier and analog-to-digital converter circuitry for use in processing the measurement signal from temperature sensing apparatus 250. Further, the signal processing circuitry 272 may include display decoder functionality to drive indicator 260. In other words, for example, the thermocouple 252 provides the temperature measurement signal and the signal processing circuitry 272 processes the signal and provides a temperature parameter for display on indicator 260.

For example, in one or more embodiments, the temperature parameter may be a numerical temperature for display, the temperature parameter may be an indication that a certain temperature (e.g., indicating excessive heat) has been reached, and/or any other temperature parameter based on the temperature measurement signal that may be beneficial to a user. The indicator 260 may be any indicator suitable for providing a usable parameter to a user. For example, indicator 260 may be any suitable display, such as, for example, an LCD display, or the like.

The indicator 260, at least in one embodiment, may be integrated into the socket lid assembly 320. For example, the indicator 260 may be a display viewable only when the socket lid assembly 320 is in a closed state (e.g., is latched and the socket lid assembly 320 covers the socket cavity 303). For example, display 260 may be located on the outside of the adapter apparatus 200, such as on the top or side of the adapter apparatus 200 (e.g., the socket lid assembly).

At least in one embodiment, the temperature measurement circuitry 270 is integrated into the socket lid assembly 320. For example, the temperature measurement circuitry 270 may be located within a void 257 of the torque assembly 220 (e.g., allowing easy connection to the display indicator 260 and the temperature sensing apparatus 250). However, the temperature measurement circuitry 270 may be located at any other portion of the socket lid assembly 320 (e.g., compression plate, etc.).

As such, and in operation, a method of testing packaged devices is provided using one or more embodiments of the adapter apparatus 200 described herein. For example, the method or operation may include positioning a packaged device 15 in the socket cavity 230, closing the socket lid assembly 320 to apply a force upon the packaged device 15 received in the socket cavity 303 of the adapter body 301 such that the plurality of contact elements of the packaged device 15 are electrically connected to conductive elements corresponding thereto. A temperature sensing apparatus is configured to touch a packaged device 15 received in the socket cavity 303 to sense the temperature of the packaged device 15 when the socket lid assembly 320 closes the socket cavity 303 and applies a force upon the packaged device 15. During the testing of one or more packaged devices, a temperature parameter based on the temperature measurement signal may be displayed, for example, using indicator 260.

In other words, at least in one or more embodiments, the electronic temperature monitoring may be integrated into the socket lid assembly 320 (e.g., the lid portion 304, the compression knob, etc.). A thermocouple sensor 252 may be electrically connected and may be exposed on the compression plate 340 which compresses the packaged device 15 onto the target board 12. At least in one or more embodiments, when a packaged device 15 is compressed, the thermocouple 252 touches the upper surface 190 of the packaged device 15 to enable sampling of the temperature measurement signal by the signal processing circuitry 272. The thermocouple 252 may be spring-loaded to achieve a proper pressure on the upper surface 190 of the packaged device 15. Power may be applied to the packaged device to start its operation or function. As the packaged device starts to function, heat is generated. The heat is sensed by the thermocouple 252 and a measurement signal representative thereof is fed to the signal processing circuitry 272 where it is processed and may be displayed by the indicator 260 (e.g., an LCD display).

All patents and references cited herein are incorporated in their entirety as if each were incorporated separately. This disclosure has been provided with reference to illustrative embodiments and is not meant to be construed in a limiting sense. As described previously, one skilled in the art will recognize that various other illustrative adapter assembly embodiments may be provided which utilize various combinations of the elements described herein. Various modifications of the illustrative embodiments, as well as additional embodiments of the disclosure and combinations of various elements herein, will be apparent to persons skilled in the art upon reference to this description. It is therefore contemplated that the patented claims will cover any such modifications or embodiments that may fall within the scope of the present invention as defined by the accompanying claims.

What is claimed is:

1. An adapter apparatus for use with a packaged device having a plurality of contact elements disposed on a surface thereof, the adapter apparatus comprising:
    an adapter body defining a socket cavity configured to receive a packaged device;
    a socket lid assembly configured to apply a force upon a packaged device received in the socket cavity of the adapter body such that the plurality of contact elements of the packaged device are electrically connected to conductive elements corresponding thereto;
    an actuation apparatus associated with the socket lid assembly, wherein the actuation apparatus is actuated when the socket lid assembly closes the socket cavity and applies a force upon the packaged device, and further wherein the actuation apparatus associated with the socket lid assembly comprises a compressible element at a surface of the socket lid assembly that is actuated upon contact with the packaged device when the socket lid assembly closes the socket cavity and applies a force upon the packaged device;
    counter circuitry configured to increment a count when the actuation apparatus is actuated; and
    an indicator configured to display a parameter based on the incremented count.

2. The adapter apparatus of claim 1, wherein the indicator is configured to display a count of the number of times the actuation apparatus is actuated.

3. The adapter apparatus of claim 2, wherein the adapter apparatus comprises reset circuitry to reset the count to zero.

4. The adapter apparatus of claim 1, wherein the indicator comprises a display viewable only when the socket lid assembly is in an open state such that a packaged device may be received within the socket cavity.

5. The adapter apparatus of claim 1, wherein the counter circuitry is integrated into the socket lid assembly.

6. The adapter apparatus of claim 1, wherein the adapter apparatus further comprises:
    a temperature sensing apparatus associated with the socket lid assembly, wherein the temperature sensing apparatus comprises a sensing element that is configured to touch a packaged device received in the socket cavity to sense the temperature of the packaged device when the socket lid assembly closes the socket cavity and applies a force upon the packaged device; and
    a temperature indicator configured to display a parameter based on the sensed temperature.

7. A method of testing packaged devices using an adapter apparatus, wherein each of the packaged devices comprise a plurality of contact elements disposed on a surface thereof, wherein the method comprises:
    providing an adapter body defining a socket cavity therein configured to receive a packaged device;
    providing a socket lid assembly configured to apply a force upon a packaged device received in the socket cavity of the adapter body such that the plurality of contact elements of the packaged device are electrically connected to conductive elements corresponding thereto;
    positioning a packaged device in the socket cavity;
    closing the socket lid assembly to apply a force upon the packaged device received in the socket cavity of the adapter body such that the plurality of contact elements of the packaged device are electrically connected to conductive elements corresponding thereto; and
    incrementing a counter upon closing the socket lid assembly and applying a force upon the packaged device received in the socket cavity of the adapter body, wherein incrementing the counter upon closing the socket lid assembly comprises:
        providing an actuation apparatus associated with the socket lid assembly, wherein the actuation apparatus is actuated when the socket lid assembly closes the socket cavity and applies a force upon the packaged device, and further wherein the actuation apparatus associated with the socket lid assembly comprises a compressible element at a surface of the socket lid assembly that is actuated upon contact with the packaged device when the socket lid assembly closes the socket cavity and applies a force upon the packaged device, and
        incrementing a counter based on the actuation of the actuation apparatus.

8. The method of claim 7, wherein the method further comprises:
repeating the positioning of a packaged device in the socket cavity, closing the socket lid assembly to apply a force upon the packaged device received in the socket cavity of the adapter body, and incrementing a counter upon closing the socket lid assembly for one or more additional packaged devices; and
displaying a count based on the incremented counter.

9. The method of claim 8, wherein the method further comprises resetting the incremented counter.

10. The method of claim 8, wherein displaying the count comprises displaying the count only when the socket lid assembly is in an open state such that a packaged device may be received within the socket cavity.

11. The method of claim 7, wherein the method further comprises displaying a temperature of the packaged device upon closing the socket lid assembly and applying a force upon the packaged device received in the socket cavity of the adapter body.

12. An adapter apparatus for use with a packaged device having a plurality of contact elements disposed on a surface thereof, the adapter apparatus comprising:
an adapter body defining a socket cavity configured to receive a packaged device;
a socket lid assembly configured to apply a force upon a packaged device received in the socket cavity of the adapter body such that the plurality of contact elements of the packaged device are electrically connected to conductive elements corresponding thereto;
a measurement apparatus associated with the socket lid assembly, wherein the measurement apparatus comprises a measurement element that is configured to contact a packaged device received in the socket cavity when the socket lid assembly closes the socket cavity and applies a force upon the packaged device, wherein a measurement signal is generated with use of the measurement element that is configured to contact the packaged device, wherein the measurement apparatus comprises an actuation apparatus associated with the socket lid assembly, wherein the actuation apparatus is actuated when the socket lid assembly closes the socket cavity and applies a force upon a packaged device, wherein the actuation apparatus associated with the socket lid assembly comprises a compressible element as the measurement element at a surface of the socket lid assembly that is actuated upon contact with the packaged device when the socket lid assembly closes the socket cavity and applies a force upon the packaged device; and
an indicator configured to display a parameter based on the measurement signal, wherein the indicator is configured to display a count of the number of times the actuation apparatus is actuated.

13. The adapter apparatus of claim 12, wherein the measurement apparatus associated with the socket lid assembly comprises a temperature sensing apparatus associated with the socket lid assembly, wherein the temperature sensing apparatus comprises a sensing element that is configured to touch a packaged device received in the socket cavity to sense the temperature of the packaged device when the socket lid assembly closes the socket cavity and applies a force upon the packaged device, and further wherein the indicator is configured to display a parameter based on the sensed temperature.

14. The adapter apparatus of claim 13, wherein the measurement element comprises a thermocouple configured at a surface of the socket lid assembly such that the thermocouple is in contact with the packaged device when the socket lid assembly closes the socket cavity and applies a force upon the packaged device.

15. The adapter apparatus of claim 13, wherein the indicator is viewable when the socket lid assembly is in a closed state when the socket lid assembly closes the socket cavity and applies a force upon a packaged device received within the socket cavity.

16. The adapter apparatus of claim 12, wherein the measurement apparatus further comprises measurement and display circuitry integrated into the socket lid assembly.

17. A method of testing packaged devices using an adapter apparatus, wherein each of the packaged devices comprise a plurality of contact elements disposed on a surface thereof, wherein the method comprises:
providing an adapter body defining a socket cavity therein configured to receive a packaged device;
providing a socket lid assembly configured to apply a force upon a packaged device received in the socket cavity of the adapter body such that the plurality of contact elements of the packaged device are electrically connected to conductive elements corresponding thereto;
providing a measurement apparatus associated with the socket lid assembly, wherein the measurement apparatus comprises a measurement element that is configured to contact a packaged device received in the socket cavity when the socket lid assembly closes the socket cavity and applies a force upon the packaged device, and further wherein providing the measurement apparatus comprises providing an actuation apparatus associated with the socket lid assembly, wherein the actuation apparatus associated with the socket lid assembly comprises a compressible element as the measurement element at a surface of the socket lid assembly that is actuated upon contact with the packaged device when the socket lid assembly closes the socket cavity and applies a force upon the packaged device, wherein the actuation apparatus is actuated when the socket lid assembly closes the socket cavity and applies a force upon a packaged device;
positioning a packaged device in the socket cavity;
closing the socket lid assembly to apply a force upon the packaged device received in the socket cavity of the adapter body such that the plurality of contact elements of the packaged device are electrically connected to conductive elements corresponding thereto and generating a measurement signal using the measurement element;
incrementing a counter upon closing the socket lid assembly, wherein incrementing the counter upon closing the socket lid assembly comprises incrementing the counter based on the actuation of the actuation apparatus; and
displaying a parameter based on the measurement signal, wherein displaying the parameter based on the measurement signal comprises displaying a count of the number of times the actuation apparatus is actuated.

18. The method of claim 17, wherein providing the measurement apparatus comprises providing a temperature sensing apparatus associated with the socket lid assembly, wherein the temperature sensing apparatus comprises a temperature sensing element that is configured to touch a packaged device received in the socket cavity to sense the temperature of the packaged device when the socket lid assembly closes the socket cavity and applies a force upon the packaged device, and further wherein displaying a parameter based on the measurement signal comprises displaying a parameter based on the sensed temperature.

19. The method of claim 18, wherein the sensing element comprises a thermocouple configured at a surface of the socket lid assembly such that the thermocouple is in contact with the packaged device when the socket lid assembly closes the socket cavity and applies a force upon the packaged device.

20. The method of claim 18, wherein displaying a parameter based on the sensed temperature comprises displaying a temperature at a location viewable when the socket lid assembly is in a closed state when the socket lid assembly closes the socket cavity and applies a force upon a packaged device received within the socket cavity.

* * * * *